United States Patent
Campbell et al.

(10) Patent No.: US 9,795,055 B1
(45) Date of Patent: Oct. 17, 2017

(54) ELECTRONICS COOLING ASSEMBLY WITH MULTI-POSITION, AIRFLOW-BLOCKING MECHANISM

(71) Applicant: INTERNATIONAL BUSINESS MACHINES CORPORATION, Armonk, NY (US)

(72) Inventors: Levi A. Campbell, Poughkeepsie, NY (US); Milnes P. David, Fishkill, NY (US); Dustin W. Demetriou, Poughkeepsie, NY (US); Michael J. Ellsworth, Jr., Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/131,180

(22) Filed: Apr. 18, 2016

(51) Int. Cl.
*H05K 7/20* (2006.01)
*G06F 1/20* (2006.01)

(52) U.S. Cl.
CPC ......... *H05K 7/20145* (2013.01); *G06F 1/203* (2013.01); *H05K 7/20409* (2013.01); *H05K 7/20745* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548;
(Continued)

(56) References Cited

U.S. PATENT DOCUMENTS 6,272,007 B1   8/2001   Kitlas et al.
6,452,797 B1 * 9/2002   Konstad ................ H01L 23/467
                                                  165/80.3
(Continued)

FOREIGN PATENT DOCUMENTS

EP         1 912 110 A1    4/2008

OTHER PUBLICATIONS

Fowler, Kim, "Heat Transfer and Cooling", IEEE Instrumentation & Measurement Magazine, Mar. 2001 (pp. 48-51).

*Primary Examiner* — Anthony Haughton
*Assistant Examiner* — Razmeen Gafur
(74) *Attorney, Agent, or Firm* — Steven Chiu, Esq.; Kevin P. Radigan, Esq.; Hesline, Rothenberg, Farley & Mesiti

(57) ABSTRACT

Electronics cooling assemblies are provided which include an air-cooled heat sink, an auxiliary air-moving device, and an airflow-blocking mechanism. The heat sink couples to one or more heat-generating electronic components, and dissipates heat from the electronic component(s) to a cooling airflow passing across the heat sink. The auxiliary air-moving device provides, when active, an increased flow rate of the cooling airflow across the heat sink. The airflow-blocking mechanism toggles between a passive airflow position and an active airflow position. In the passive airflow position, the airflow-blocking mechanism allows the cooling airflow to exhaust from the heat sink without passing through the air-moving device, and in the active airflow position, the airflow-blocking mechanism allows the cooling airflow to exhaust from the auxiliary air-moving device.

19 Claims, 13 Drawing Sheets

(58) Field of Classification Search
USPC ... 257/712–722, E23.088; 24/453, 458–459; 454/184; 312/236
See application file for complete search history.

(56) References Cited

U.S. PATENT DOCUMENTS

| | | | | |
|---|---|---|---|---|
| 6,556,438 | B1* | 4/2003 | Bologna | H05K 7/20727 361/679.48 |
| 6,819,563 | B1* | 11/2004 | Chu | G11B 33/1406 165/104.33 |
| 7,486,519 | B2 | 2/2009 | Loiler et al. | |
| 8,369,092 | B2 | 2/2013 | Atkins et al. | |
| 9,016,352 | B2* | 4/2015 | Helbig | F28F 9/007 165/67 |
| 2003/0095381 | A1* | 5/2003 | Lee | H05K 7/20563 361/679.49 |
| 2006/0087813 | A1* | 4/2006 | Becker | G06F 1/183 361/694 |
| 2006/0087814 | A1* | 4/2006 | Brandon | H05K 7/20563 361/694 |
| 2007/0201211 | A1* | 8/2007 | Loiler | G06F 1/20 361/720 |
| 2007/0236881 | A1* | 10/2007 | Harder | H05K 7/202 361/695 |
| 2011/0038120 | A1* | 2/2011 | Merz | G02F 1/133308 361/679.47 |
| 2011/0075362 | A1* | 3/2011 | Tomioka | H05K 7/20172 361/696 |
| 2011/0222244 | A1* | 9/2011 | Takashiro | H02M 7/003 361/704 |
| 2011/0261526 | A1* | 10/2011 | Atkins | G06F 1/187 361/679.33 |
| 2012/0020017 | A1* | 1/2012 | Kehret | G06F 1/183 361/679.54 |
| 2012/0262880 | A1* | 10/2012 | Tsuchida | G06F 1/20 361/697 |
| 2012/0268890 | A1* | 10/2012 | Stock | G06F 1/20 361/679.53 |
| 2013/0050951 | A1* | 2/2013 | Zhou | G06F 1/20 361/720 |
| 2013/0208422 | A1* | 8/2013 | Hughes | H05K 7/20445 361/700 |
| 2013/0242542 | A1* | 9/2013 | Uchimi | H05K 7/20136 362/97.1 |
| 2013/0342993 | A1* | 12/2013 | Singleton | H05K 7/20836 361/690 |
| 2014/0036440 | A1* | 2/2014 | Inoue | H01L 23/467 361/692 |
| 2014/0063739 | A1* | 3/2014 | Liu | H05K 7/20909 361/697 |
| 2014/0078669 | A1* | 3/2014 | Ooe | G06F 1/203 361/679.47 |
| 2014/0233177 | A1* | 8/2014 | Weidner | G06F 1/20 361/679.48 |
| 2014/0268549 | A1* | 9/2014 | Neumann | H05K 7/20772 361/679.47 |

\* cited by examiner

ELECTRONICS COOLING ASSEMBLY WITH MULTI-POSITION, AIRFLOW-BLOCKING MECHANISM

BACKGROUND

In many server applications, processors, along with their associated electronics (e.g., memory, disk drives, power supplies, etc.), are packaged in removable drawer or subsystem configurations stacked within an electronics rack or frame comprising information technology (IT) equipment. In other cases, the electronics may be in fixed locations within the rack or frame. As circuit densities continue to increase at all levels of packaging, there is an ever-growing need for providing enhanced cooling to the electronics rack(s), including the electronic subsystems thereof. As one solution, cooling apparatuses may be provided which include one or more rack-level or server-level, air-moving assemblies which facilitate moving airflow through the electronics racks, typically front-to-back. These rack-level or server-level fans are in addition to the computer-room, air-moving assemblies, such as computer-room air-conditioner (CRAC) units or computer-room air-handler (CRAH) units, which provide air movement within the data center, and thus, cooling to the data center. To meet the ever-growing need for additional cooling within electronics racks of a data center, further air-distribution enhancements are needed.

SUMMARY

The shortcomings of the prior art and additional advantages are provided through the provision, in one or more aspects, of an electronics cooling assembly. The electronics cooling assembly includes: an air-cooled heat sink to couple to one or more heat-generating electronic components to be cooled, the air-cooled heat sink to dissipate heat from the one or more heat-generating electronic components to a cooling airflow passing across the air-cooled heat sink; an auxiliary air-moving device associated with the air-cooled heat sink and providing, when active, an increased flow rate of the cooling airflow across the air-cooled heat sink; and an airflow-blocking mechanism, the airflow-blocking mechanism toggling between a passive airflow position and an active airflow position, wherein in the passive airflow position, the airflow-blocking mechanism allows the cooling airflow to exhaust from the air-cooled heat sink without passing through the auxiliary air-moving device, and in the active airflow position, the airflow-blocking mechanism allows the cooling airflow to exhaust from the auxiliary air-moving device.

Advantageously, the electronics cooling assemblies described herein enhance operation of one or more heat-generating electronic components with selective passive or active multi-mode cooling of the electronic component(s). In a passive cooling mode, with the one or more electronic components, for instance, in a nominal operating condition, quiet, energy efficient air-cooling of the components is provided, while in an active cooling mode, the electronics cooling assembly provides high-performance air-cooling to the one or more electronic components dissipating a high-heat load. Advantageously, the cooling electronics assemblies disclosed herein may be employed with a low-profile electronics card, such as an input/output adapter card (e.g., Peripheral Component Interconnect Express (PCIe) card), a Graphics Processing Unit (GPU) card, etc. Positioning of the multi-position, airflow-blocking mechanism of the electronics cooling assembly may be passively determined by, for instance, the state of the auxiliary air-moving device. If the auxiliary air-moving device is inactive, momentum of the rack-level cooling airflow passing across the air-cooled heat sink ensures that the airflow-blocking mechanism is in a passive airflow position, and upon activating the auxiliary air-moving device, the momentum of the exhausting air from the auxiliary air-moving device forces the airflow-blocking mechanism to transition to an active airflow position.

By way of enhancement, in one or more embodiments, the auxiliary air-moving device may overlie, at least in part, the air-cooled heat sink, and the air-cooled heat sink may include an air-exhaust side, and the auxiliary air-moving device may include an air-exhaust side. The cooling airflow exhausts from the air-exhaust side of the air-cooled heat sink when the airflow-blocking mechanism is in the passive airflow position, and exhausts from the air-exhaust side of the auxiliary air-moving device when the airflow blocking mechanism is in the active airflow position.

In one or more implementations, the airflow-blocking mechanism may include a toggle element with a first airflow-blocking arm and a second airflow-blocking arm disposed at a fixed angle. In the passive airflow position, the first airflow-blocking arm of the toggle element inhibits airflow from exhausting from the air-exhaust side of the air-moving device, and in the active airflow position, the second airflow-blocking arm of the toggle element inhibits airflow from exhausting from the air-exhaust side of the air-cooled heat sink. In one or more implementations, the air-exhaust side of the air-cooled heat sink and the air-exhaust side of the air-moving device may face a common direction, for instance, the air-exhaust side of the air-cooled heat sink and the air-exhaust side of the auxiliary air-moving device may substantially align, one above the other. Further, the first airflow-blocking arm of the toggle element may be orthogonal to the second airflow-blocking arm of the toggle element, and the toggle element may pivot to transition the airflow-blocking mechanism from the passive airflow position to the active airflow position with activating of the auxiliary air-moving device.

In one or more implementations, the auxiliary air-moving device may be a centrifugal fan, with the centrifugal fan overlying, at least in part, the air-cooled heat sink, and having an air-inlet side facing the air-cooled heat sink. By way of example, the air-cooled heat sink may include a thermally conductive base, with a plurality of thermally conductive fins extending from the thermally conductive base. With the airflow-blocking mechanism in the passive airflow position, the cooling airflow moves across the plurality of thermally conductive fins in a direction substantially parallel to the thermally conductive base of the air-cooled heat sink, between the thermally conductive base of the air-cooled heat sink and the centrifugal fan. In one or more embodiments, the thermally conductive fins of the plurality of thermally conductive fins may be recessed, at least in part, to accommodate the centrifugal fan within a recessed region of the plurality of thermally conductive fins. This implementation is particularly advantageous in a low-profile electronics cooling implementation.

In one or more embodiments, with the auxiliary air-moving device inactive, the cooling airflow passing across the air-cooled heat sink maintains the airflow-blocking mechanism in the passive airflow position, and with activation of the auxiliary air-moving device, the increased flow rate of cooling airflow passing through the auxiliary air-moving device transitions the airflow-blocking mechanism from the passive airflow position to the active airflow position.

In one or more enhanced embodiments, one or more baffles may be associated with the air-cooled heat sink to facilitate directing the cooling airflow from an air-inlet side of the air-cooled heat sink, across the air-cooled heat sink, towards an air-exhaust side of the air-cooled heat sink. In addition, the auxiliary air-moving device may overlie the air-cooled heat sink closer to the air-exhaust side of the air-cooled heat sink than the air-inlet side of the air-cooled heat sink.

In another aspect, a cooled electronics assembly is provided which includes at least one heat-generating electronic component, and an electronics cooling assembly. The electronics cooling assembly includes: an air-cooled heat sink coupled to the at least one heat-generating electronic component, the air-cooled heat sink dissipating heat from the at least one heat-generating electronic component to a cooling airflow passing across the air-cooled heat sink; an auxiliary air-moving device associated with the air-cooled heat sink and providing, when active, an increased flow rate of the cooling airflow across the air-cooled heat sink; and an airflow-blocking mechanism, the airflow-blocking mechanism toggling between a passive airflow position and an active airflow position, wherein in the active airflow position, the airflow-blocking mechanism allows the cooling airflow to exhaust from the air-cooled heat sink without passing through the auxiliary air-moving device, and in the active airflow position, the airflow-blocking mechanism allows the cooling airflow to exhaust from the auxiliary air-moving device.

In a further aspect, a method of fabricating an electronics cooling assembly is provided. The method includes: providing an air-cooled heat sink coupled to one or more heat-generating electronic components to be cooled, the air-cooled heat sink to dissipate heat from the one or more heat-generating electronic components to a cooling airflow passing across the air-cooled heat sink; associating an auxiliary air-moving device with the air-cooled heat sink, the auxiliary air-moving device providing, when active an increased flow rate of the cooling airflow across the air-cooled heat sink; and providing an airflow-blocking mechanism, the airflow-blocking mechanism toggling between a passive airflow position and an active airflow position, wherein in the passive airflow position, the airflow-blocking mechanism allows the cooling airflow to exhaust from the air-cooled heat sink without passing through the auxiliary air-moving device, and in the active airflow position, the airflow-blocking mechanism allows the cooling airflow to exhaust from the auxiliary air-moving device.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
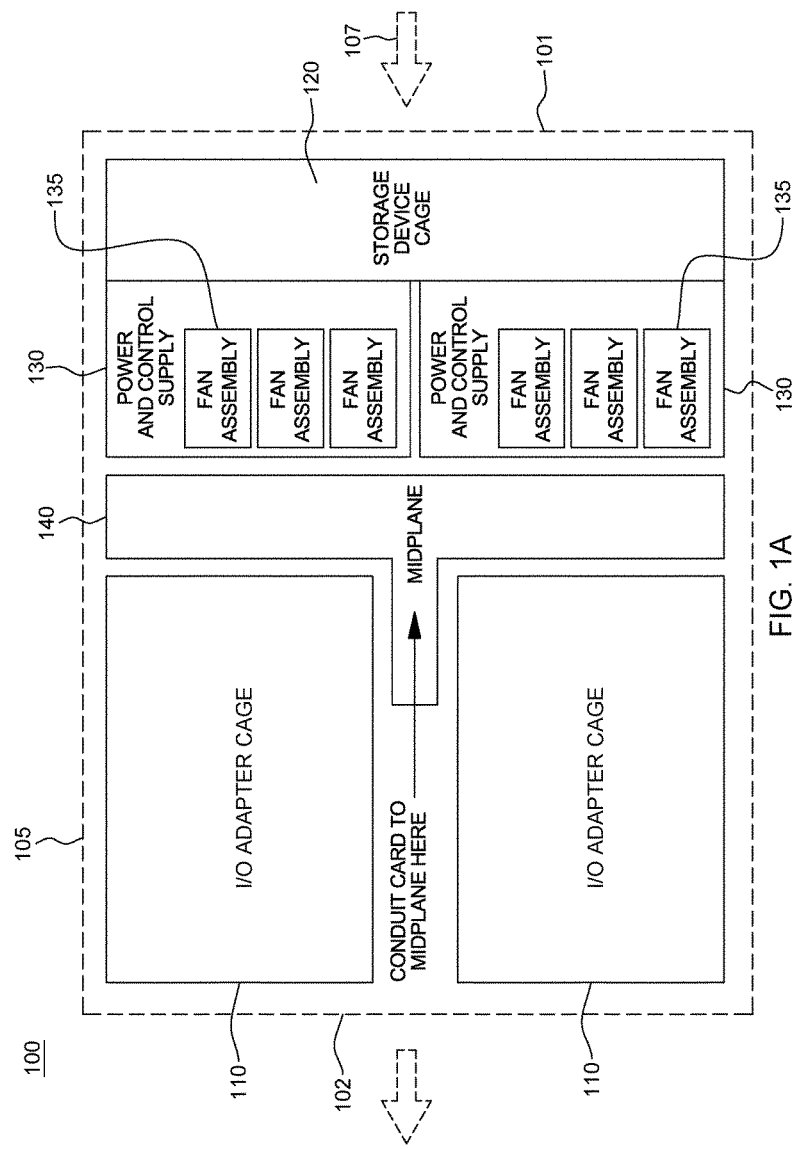
FIG. 1A is a simplified plan view of one embodiment of an input/output (I/O) and disk expansion subsystem for an electronics rack, which may include one or more electronics cooling assemblies, in accordance with one or more aspects of the present invention.

In one or more implementations, an air-cooled data center may include multiple electronics racks disposed in one or more rows. For instance, a data center may house several hundred, or even several thousand microprocessors. In one or more embodiments, chilled air may enter the computer room via perforated airflow tiles from an air supply plenum defined between a raised floor and a base or subfloor of the room. Cooled air is taken in through louvered or screened doors at the front (i.e., air-inlet sides) of the electronics racks, and expelled through the back (i.e., air-outlet sides) of the electronics racks. Each electronics rack may have one or more rack-level, and/or server-level air-moving devices (e.g., axial and/or centrifugal fans) to provided forced inlet-to-outlet airflow through the rack to cool the electronic components within the electronics rack. The supply air plenum may provide conditioned and cooled air to the air-inlet sides of the electronics racks via the perforated tiles disposed in, for instance, a "cold aisle" of the computer installation. The conditioned and cooled air may be supplied to the cold air plenum by one or more air-conditioning units, also disposed within the data center. Room air may be taken into each air-conditioning unit near an upper portion thereof, and this room air may comprise, in part, exhausted air from the "hot aisles" of the computer installation, defined by opposing air-outlet sides of the electronics racks.

In one or more implementations, an electronics rack may comprise one or more electronic subsystems, one or more of which may require additional input/output or storage capability. As one example, one or more electronic subsystems within an electronics rack may be server units requiring additional input/output and/or computer storage capability. As one specific example, the electronics rack may be an IT enterprise computer system, implemented, for instance, employing z System server units, or Power System server units, or LinuxOne server units, offered by International Business Machines Corporation. Z System, Power System and LinuxOne are trademarks of International Business Machines Corporation, of Armonk, N.Y., USA.

By way of further example, an electronics rack may include a plurality of electronic subsystems, which in one or more embodiments, are air-cooled by a cooling airflow passing from the air-inlet side to the air-outlet side of the electronics rack, where the airflow is exhausted as hot air out the air-outlet side of the rack. Depending upon the rack implementation, additional input/output capacity and/or storage device capacity may be desired than can be provided within the individual electronic subsystems (for instance, individual computer server units) of the electronics rack. For example, to allow for greater throughput and virtualization that higher-end computer systems are capable of implementing today, additional I/O adapter slots and additional device storage slots than can currently be accommodated within the computer server units of the rack may be desired. In addition, virtualized servers typically require dedicated local non-volatile disk storage for each logical partition, and the disk space for this non-volatile storage is often not adequate within the server units or subsystems of the rack.

An electronics rack may therefore also include, for instance, an input/output (I/O) and disk expansion subsystem. In one or more implementations, the I/O and disk expansion subsystem may include input/output card slots, such as PCIe card slots, and disk drivers for one or more electronic subsystems of the electronics rack. Such an I/O and disk expansion subsystem may be disposed anywhere within the electronics rack.

Reference is made below to the drawings, where the same reference numbers used throughout different figures designate the same or similar components.

FIGS. 1A-2C depict one example of an input/output (I/O) and disk expansion subsystem for an electronics rack. Note in this regard that the use of "disk" throughout this discussion refers generally to any storage unit, and not to any particular type of storage unit, such as a disk drive.

As explained further below, the I/O and disk expansion subsystem may comprise very high-density, high-modularity, field-replaceable units. For instance, FIGS. 1A & 1B are schematic depictions of one or more embodiments of an I/O and disk expansion subsystem 100 for an electronics rack, which may employ various field-replaceable units.

Figure 1B:
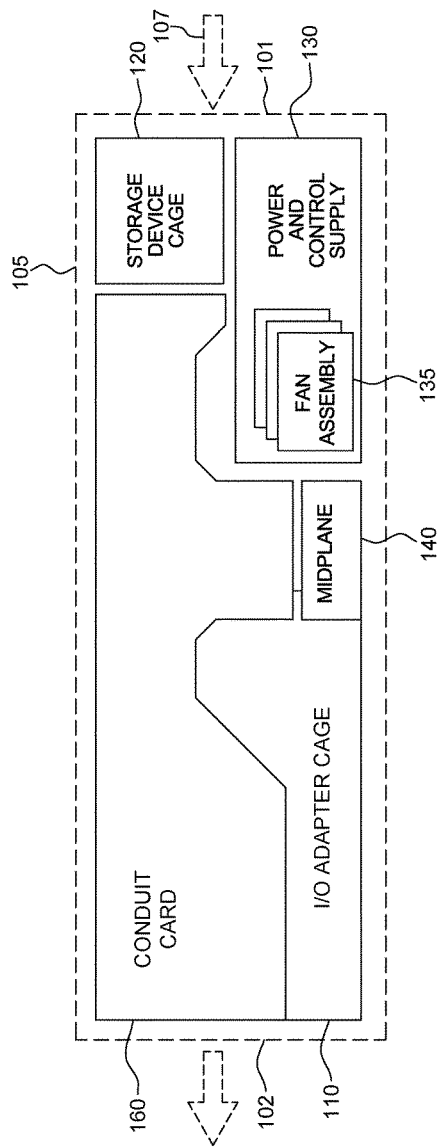
FIG. 1B is an elevational view of the I/O and disk expansion subsystem of FIG. 1A.

As shown in FIGS. 1A &1B, I/O and disk expansion subsystem 100 may include an I/O and disk expansion subsystem enclosure 105 having a front side 101 and a back side 102, as well as two input/output adapter cages 110, a storage device cage 120, two power and control supplies 130, each of which may include three fan assemblies 135, a mid-plane connector card 140, and a conduit card 160. The input/output adapter cages 110 may be a common building block between multiple I/O and disk expansion subsystems and may be, in one specific example, a PCIe cage offering, for instance, ten PCIe slots (or bays) for ten blind-swap cassettes holding ten PCIe adapters. These PCIe adapters are one example of a low-profile electronics card which may benefit from an electronics cooling assembly such as described herein.

Storage device cage 120 may be, in one or more examples, a Direct Access Storage Device (DASD) cage which includes a printed circuit board housed in a mechanical cage that offers multiple Serial Attached SCSI (SAS) Small Form Factor (SFF) disk drive bays and multiple slots for port expander cards. The storage device cage connects the port expander cards electrically with SAS wires to the disk drives within the cage, and also connects the port expander cards to SAS wires coming from the conduit card 160. Each power and control supply 130 converts (by way of example) 350 V DC input power within the rack into the DC voltage levels required by, for instance, the expansion subsystem. In addition, it may have a microprocessor that communicates with and controls other building blocks within the subsystem enclosure. The power and control supply may turn on soft switches to components within the building blocks, initialize chips and release them from reset, control the fan speeds, read part numbers and EC information, and other control functions. Each power and control block may house, for instance, three fan assemblies 135, which in one or more implementations, may be identical fan assemblies that provide primary, rack-level cooling airflow 107 through the I/O and disk expansion subsystem 100 portion of the electronics rack, for instance, from the air-inlet side (front side 101) to the air-outlet side (back side 102) of the electronics rack.

As depicted, two power and control supplies 130 may be employed in the expansion subsystem 100 for redundancy, each of which itself can power and control the entire I/O disk expansion subsystem 100. As noted, each power and control supply 130 may accept, for instance 350V DC input power and generate the necessary DC voltage levels for the enclosure. For instance, in one specific example of an expansion subsystem 100, this may include 12V and 5V to SAS SFF disk drives, as well as 12V and 3.3V to the PCIe input/output adapter slots. Also, other voltages, including 1.2V, 1.5V and 1.8V may be required for bridge chips and expander chips in the PCIe cage and port expanders. Each power and control supply may have two 350V power connectors. The 350V power cables (not shown) that plug into these connectors may have built-in control signals. In one or more implementations, the subsystems can be controlled by the data center through the bulk power assembly in the rack, via this connection and the 350V power cable. As another embodiment of the power and control supply, a standard interface, such as Ethernet interface, could be provided to facilitate controlling the expansion subsystem.

The mid-plane connector card 140 may include connectors that allow for the power and control supplies 130 to plug into the mid-plane connector card to, for instance, distribute the DC power and control signals from the power and control supplies 130 to the input/output adapter cages 110, the storage device cage 120, and other circuitry within the subsystem enclosure. Conduit card 160 and the input/output adapter cages may also dock to (or plug into) mid-plane connector card 140.

Figure 2A:
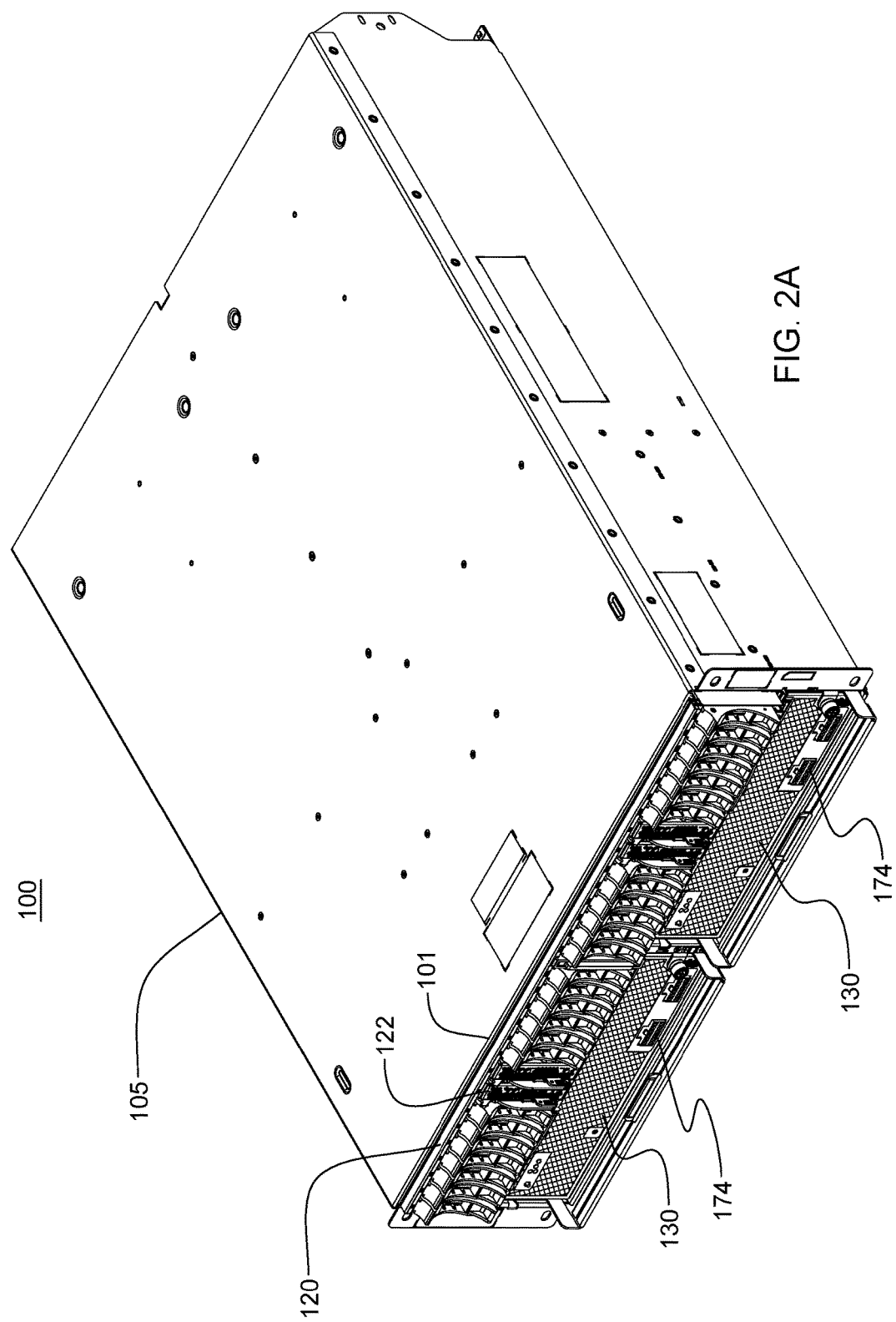
FIG. 2A is a detailed front isometric view of one embodiment of the I/O and disk expansion subsystem depicted in FIGS. 1A & 1B.
Figure 2B:
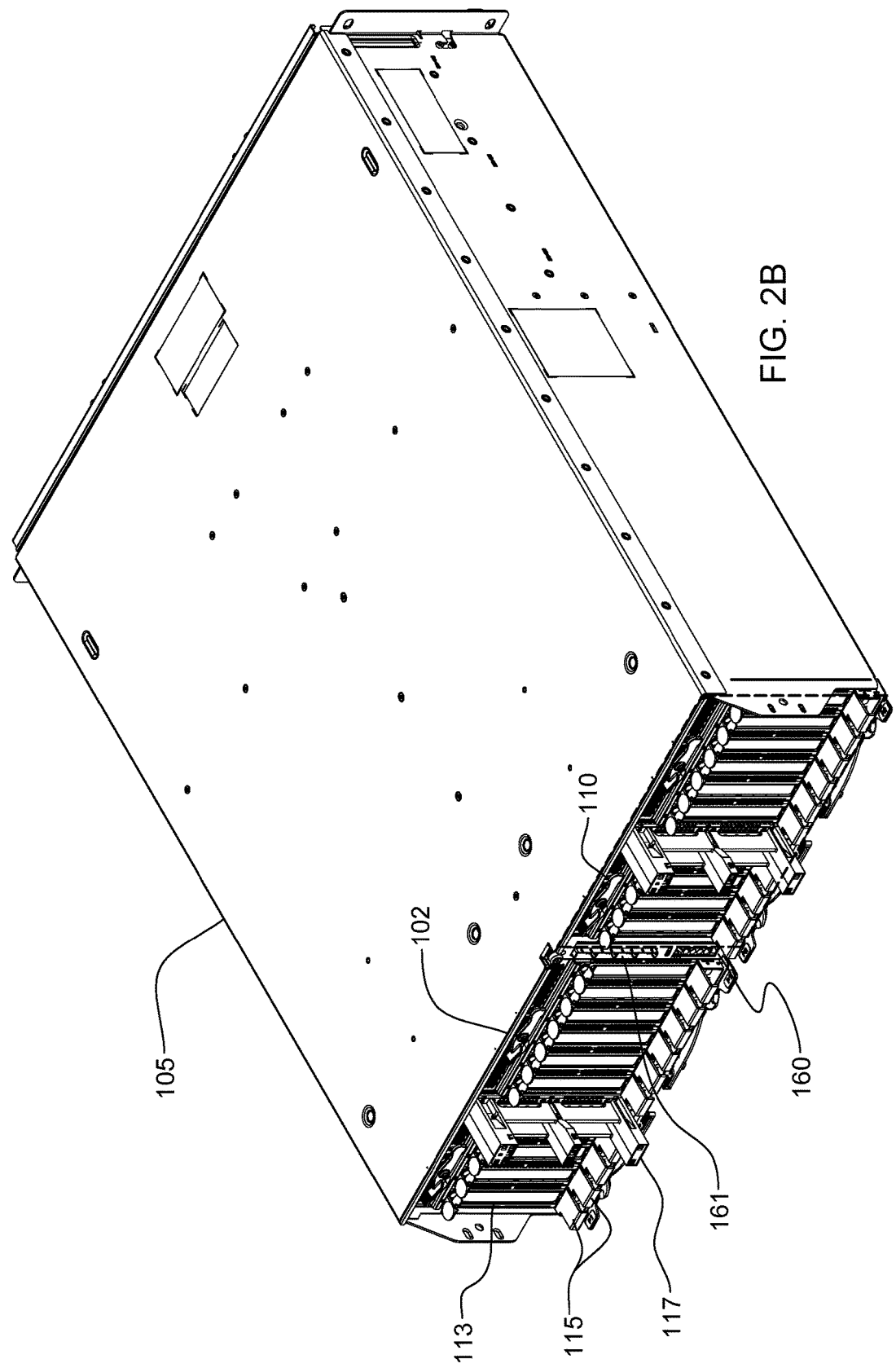
FIG. 2B is a back isometric view of one embodiment of the I/O and disk expansion subsystem of FIG. 2A.
Figure 2C:
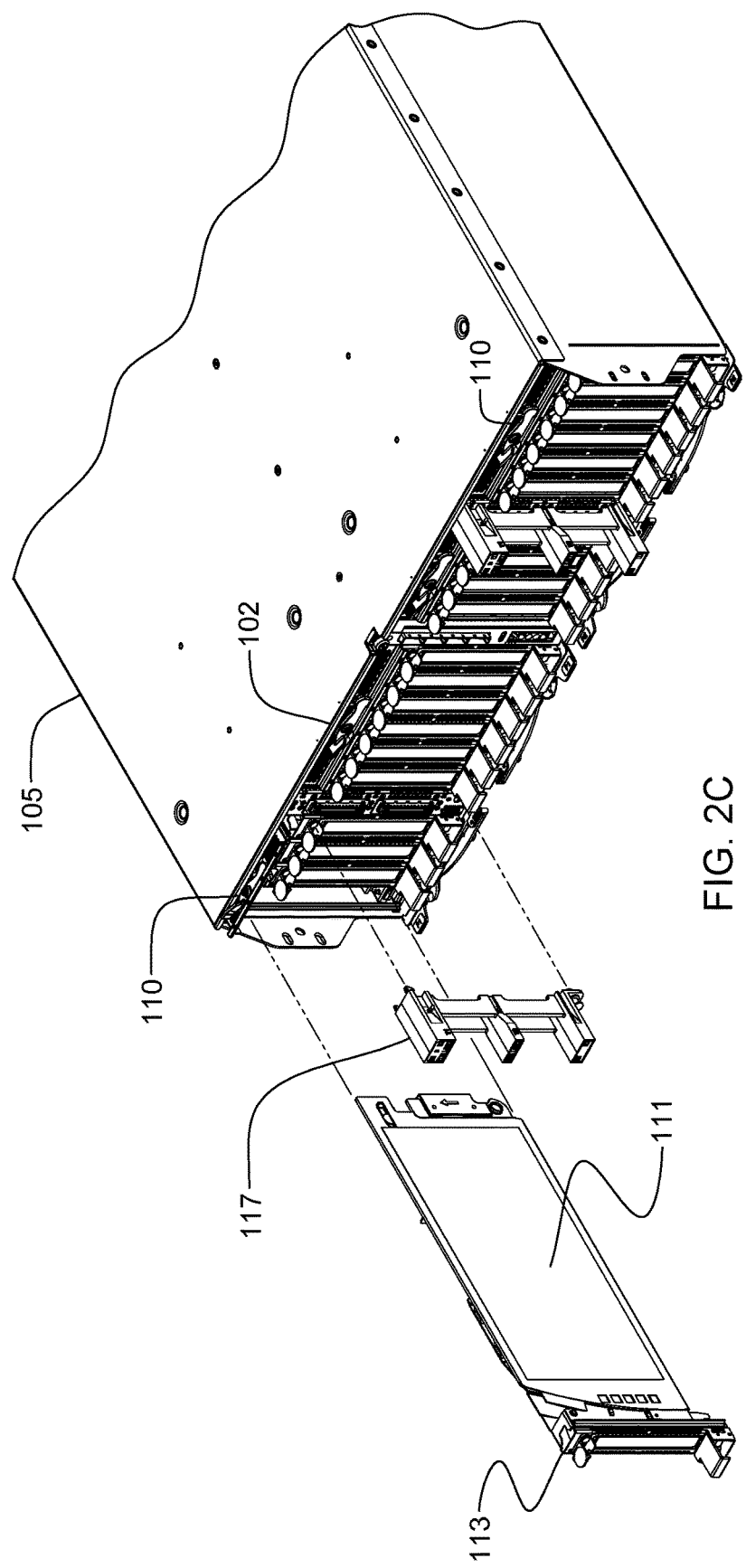
FIG. 2C is a partial back isometric view of the I/O and disk expansion subsystem of FIGS. 2A-2B, after positioning of input/output adapter cages within the I/O and disk expansion subsystem enclosure, and illustrating one embodiment of an input/output adapter card and blind swap cassette removed from one of the input/output adapter cages, and which may include an electronics cooling assembly, in accordance with one or more aspects of the present invention.

FIGS. 2A-2C depict in greater detail one embodiment of I/O and disk expansion subsystem 100. Referring to FIG. 2A, the I/O and disk expansion subsystem 100 is illustrated from front side 101. I/O disk expansion subsystem 100 includes an I/O and disk expansion subsystem enclosure 105, which accepts and houses the building blocks of the subsystem illustrated in FIGS. 1A & 1B. This enclosure is sized and configured to reside within, by way of example, an electronics rack. One embodiment of a storage device cage 120 is shown. In this embodiment, storage device cage 120 is a DASD cage which houses, for instance, a total of 26 disk drives controlled by four port expander cards 122. Port expander cards 122 have expander chips which control power and SAS traffic to the disk drives. The power expander cards 122 may be a building block of the system that is field-replaceable. Two power and control supplies 130 are illustrated for redundancy, each comprising a 350V DC power cable connector 174 for connecting rack power to the expansion system enclosure 105.

FIG. 2B illustrates one embodiment of I/O and disk expansion subsystem enclosure 105 from back side 102, and shows input/output adapter cages 110 in operative position, populated with input/output adapters. In one example, input/output adapter cages 110 are PCIe cages, which are shown installed within the system enclosure 105. Each PCIe cage accepts, for instance, blind-swap cassettes 113, which are either employed as filler for airflow and electromagnetic sealing, or to house a respective PCIe card and mate it to the PCIe cage. Tabs 115 on the blind-swap cassettes 113 may be used to actuate the respective PCIe cards downwards to plug their edge connectors to the respective connector in the PCIe cage. Strain relief brackets 117 and an edge of conduit card 160 are also illustrated. In one embodiment, the edge of conduit card 160 includes, for instance, four SAS 4-lane 3G bps ports 161.

In FIG. 2C, the back side 102 of I/O disk expansion subsystem enclosure 105 is again illustrated, with the input/output adapter cages 110 shown in operative position and populated with, for instance, PCIe cards 111, each residing within a respective blind-swap cassette 113. One blind-swap cassette and PCIe card subassembly is shown exploded from the respective input/output adapter cage slot. The strain relief bracket 117 is also illustrated, which in one embodiment, may be an InfiniBand cable strain relief bracket.

Referring collectively to FIGS. 1A-2C, fan assemblies 135 of power and control supplies 130 provide cooling airflow 107 (FIGS. 1A & 1B) through I/O and disk expansion subsystem enclosure 105 to cool the heat-generating electronic components within the exemplary I/O and disk expansion subsystem 100 illustrated. To meet the ever-continuing need for additional cooling of selected components within, for instance, electronics racks of a data center, further air distribution enhancements are needed, such as to an air-cooled expansion subsystem, such as illustrated in FIGS. 1A-2C. For instance, low-profile cards, such as the PCIe cards (as well as in other embodiments, graphics processing unit (GPU) cards), represent a significant cooling challenge for computing systems. High-performance heat sinks may be desired to cool the high-power electronics sometimes present on these cards (for instance, up to 300 W today) in a high-power dissipation mode, especially considering warmer environments (such as, for instance, an ASHRAE A3 environment), and the fact that PCIe cards are often located at the air-outlet side of the electronics rack's mounted subsystems, such as in the example of FIGS. 1A-2C, where the PCIe cards are located adjacent to back side 102 of the I/O and disk expansion subsystem enclosure 105. Further, the acoustic and fan power implications of a high-performance heat sink are typically not desirable, and could be mitigated in many, if not the majority of, operating conditions (for instance, lower than maximum power, depopulated configurations of the server, cooler than an A3 max environment).

Disclosed hereinbelow therefore, is an electronics cooling assembly which allows for quiet, energy-efficient operation with, for instance, a nominal electronics operating condition, while also being capable of providing higher-performance cooling in a higher-power dissipation mode of the electronics. The electronics cooling assemblies presented are particularly advantageous for cooling one or more electronic components of, for instance, a low-profile electronics card, such as a PCIe card, GPU card, etc.

Generally stated, disclosed herein, in one or more aspects, is an electronics cooling assembly which includes an air-cooled heat sink to couple to one or more heat-generating electronic components to be cooled, such as to one or more electronic components of a low-profile electronics card. As noted, in one or more implementations, the low-profile electronics card might comprise a PCIe card, a GPU card, or any other low-profile electronics card to require enhanced cooling at selected times of operation. The air-cooled heat sink dissipates heat from the one or more heat-generating electronic components to a cooling airflow passing across the air-cooled heat sink. For instance, in an electronics rack implementation, the cooling airflow may be a server-level or rack-level cooling airflow provided by one or more axial or centrifugal fans disposed within the server unit or electronics rack, such as the exemplary fan assemblies 135 noted above with reference to the particular I/O and disk expansion subsystem example of FIGS. 1A-2C.

The electronics cooling assembly further includes an auxiliary air-moving device associated with the air-cooled heat sink and providing, when active, an increased flow rate of cooling airflow across the air-cooled heat sink. In addition, the electronics cooling assembly includes an airflow-blocking mechanism. The airflow-blocking mechanism toggles between a passive airflow position and an active airflow position. In the passive airflow position, the airflow-blocking mechanism allows the cooling airflow to exhaust from the air-cooled heat sink without passing through the auxiliary air-moving device, and in the active airflow position, the airflow-blocking mechanism inhibits the cooling airflow from exhausting from the air-cooled heat sink without passing through the auxiliary air-moving device.

Note that numerous inventive aspects and features of an electronics cooling assembly are disclosed herein, and unless otherwise inconsistent, each disclosed aspect or feature may be combined with any other disclosed aspect or feature as desired for a particular application, for example, for facilitating multi-mode cooling of one or more heat-generating electronic components.

By way of further example, the auxiliary air-moving device may overlie, at least in part, the air-cooled heat sink, and the air-cooled heat may include an air-exhaust side, and the auxiliary air-moving device may include an air-exhaust side. In one or more implementations, the cooling airflow exhausts from the air-exhaust side of the air-cooled heat sink with the airflow-blocking mechanism in the passive airflow position, and exhausts from the air-exhaust side of the auxiliary air-moving device with the airflow-blocking mechanism in the active airflow position.

In one or more embodiments, the airflow-blocking mechanism may include a toggle element with a first airflow-blocking arm and a second airflow-blocking arm disposed at a fixed angle. In the passive airflow position, the first airflow-blocking arm of the toggle element may inhibit airflow from exhausting from the air-exhaust side of the auxiliary air-moving device, and in the active airflow position, the second airflow-blocking arm of the toggle element may inhibit airflow from exhausting from the air-exhaust side of the air-cooled heat sink. In certain implementations, the air-exhaust side of the air-cooled heat sink and the air-exhaust side of the auxiliary air-moving device may face a common direction. For instance, the air-exhaust sides of the air-cooled heat sink and auxiliary air-moving device may substantially align. Further, in one or more embodiments, the first airflow-blocking arm of the toggle element may be orthogonal to the second airflow-blocking arm of the toggle element, and the toggle element may pivot to transition the airflow-blocking mechanism from the passive airflow position to the active airflow position with activation of the auxiliary air-moving device. Further, deactivating of the auxiliary air-moving device may result in the toggle element again pivoting to transition the airflow-blocking mechanism from the active airflow position to the passive airflow position. For instance, the momentum or flow rate of cooling airflow across the air-cooled heat sink may be, in one or more implementations, sufficient to transition the airflow-blocking mechanism from the active airflow position to the passive airflow position with deactivating of the auxiliary air-moving device.

In one or more embodiments, the auxiliary air-moving device may be a centrifugal fan, and the centrifugal fan may overlie, at least in part, the air-cooled heat sink, and have an air-inlet side facing the air-cooled heat sink. By way of example, the air-cooled heat sink may include a thermally conductive base with a plurality of thermally conductive fins extending from the thermally conductive base. With the airflow-blocking mechanism in the passive airflow position, the cooling airflow may move across or in between the plurality of thermally conductive fins in a direction substantially parallel to the thermally conductive base of the air-cooled heat sink, between (at least in part) the thermally conductive base of the air-cooled heat sink and the centrifugal fan. In one or more implementations, the thermally conductive fins of the plurality of thermally conductive fins may be recessed, at least in part, to accommodate the centrifugal fan within a recessed region of the plurality of thermally conductive fins. Such an implementation is particularly advantageous where the electronics component to be cooled is mounted to a low-profile electronics card, such as the exemplary PCIe or GPU cards discussed above.

With the auxiliary air-moving device inactive, the cooling airflow passing across the air-cooled heat sink maintains the airflow-blocking mechanism in the passive airflow position, and with activation of the auxiliary air-moving device, the increased flow rate of the cooling airflow passing through the auxiliary air-moving device transitions the airflow-blocking mechanism from the passive airflow position to the active airflow position. With deactivation of the auxiliary air-moving device, the cooling airflow passing across the air-cooled heat sink again toggles the airflow-blocking mechanism back from the active airflow position to the passive airflow position.

Figure 3A:
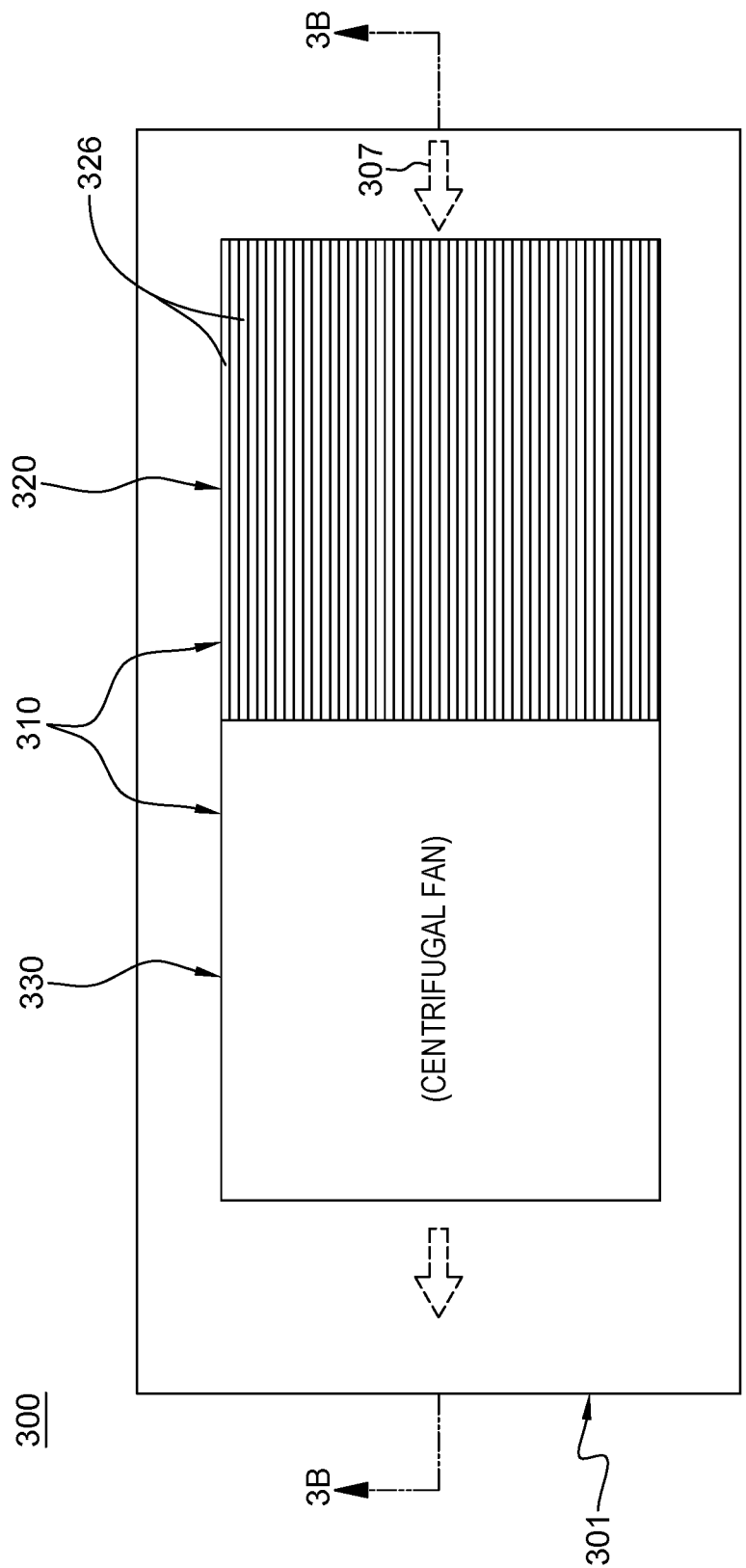
FIG. 3A is a plan view of one embodiment of a cooled electronics assembly comprising an electronics cooling assembly cooling one or more heat-generating electronic components, such as, for instance, one or more heat-generating electronic components of an input/output adapter card of the I/O and disk expansion subsystem of FIGS. 1A-2C, in accordance with one or more aspects of the present invention.
Figure 3B:
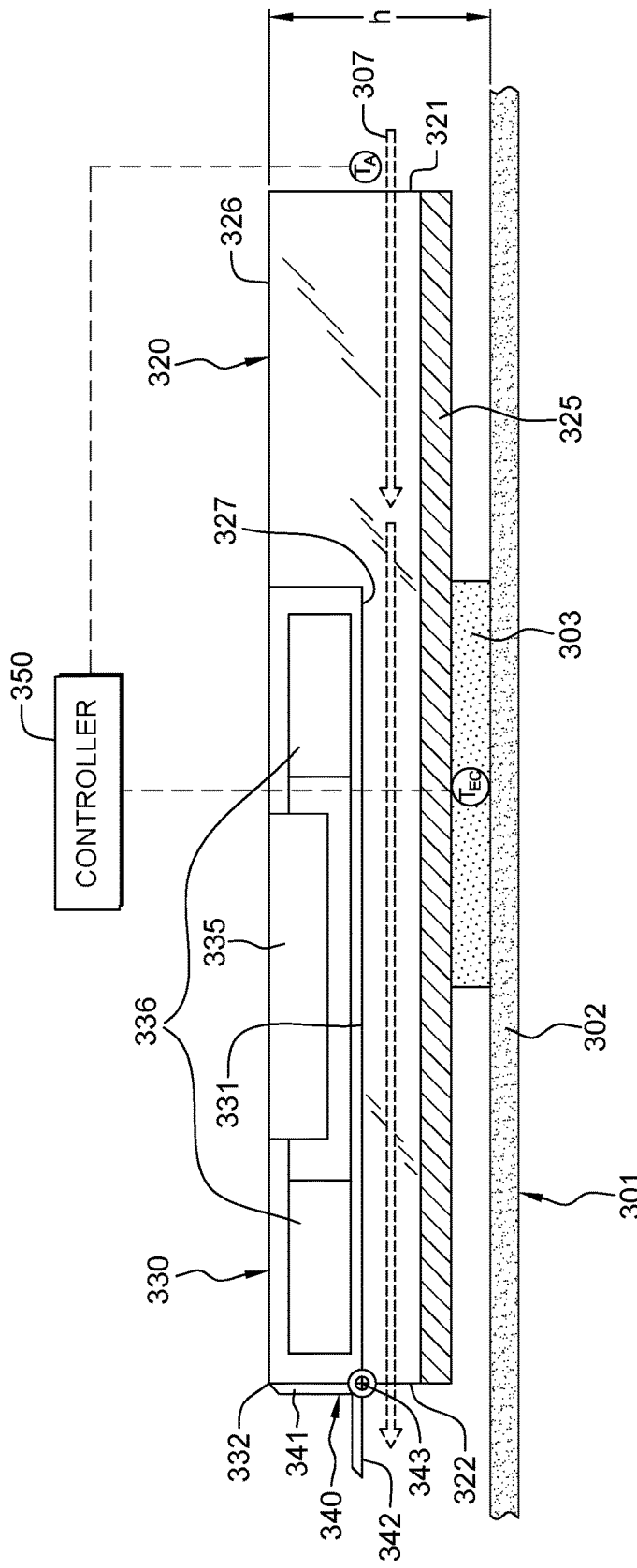
FIG. 3B is a cross-sectional elevational view of the cooled electronics assembly of FIG. 3A, taken along line 3B-3B thereof, and depicting the assembly with the airflow-blocking mechanism in a passive airflow position, in accordance with one or more aspects of the present invention.
Figure 3C:
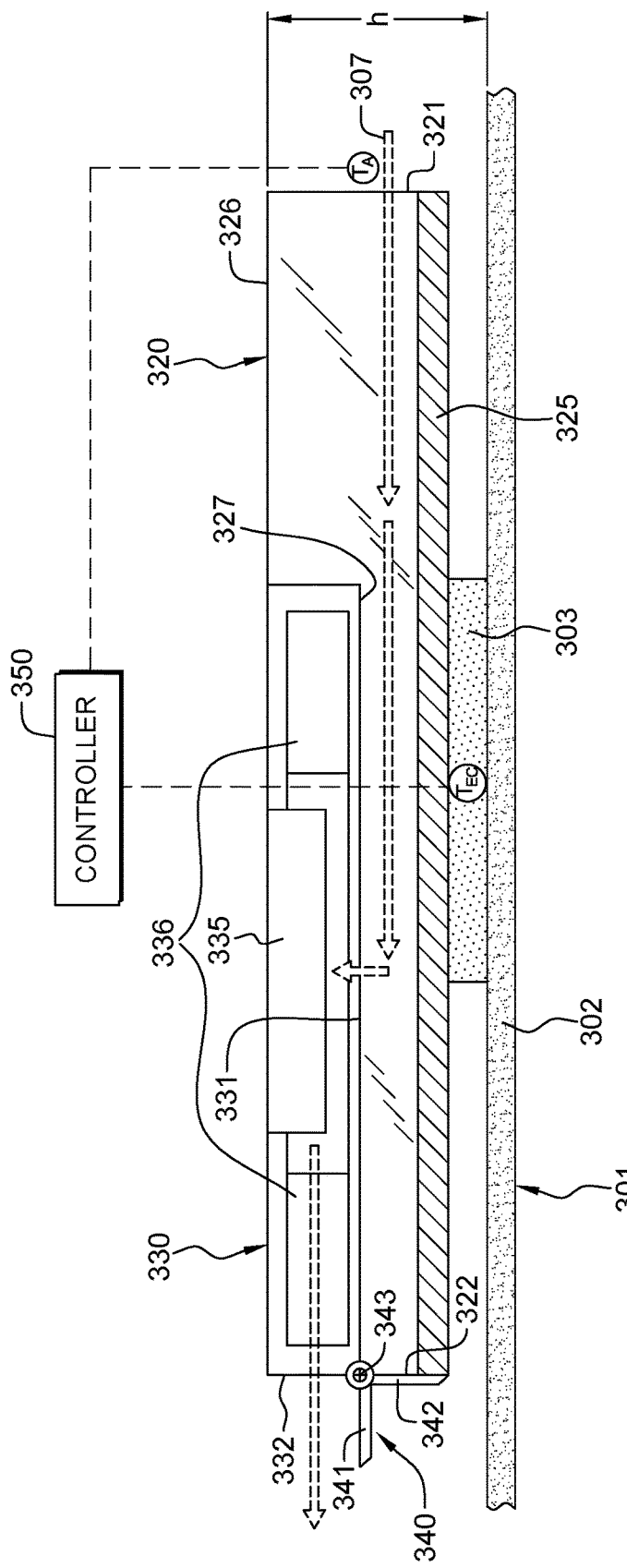
FIG. 3C depicts the electronics cooling assembly of FIG. 3B, with the airflow-blocking mechanism shown in an active airflow position, in accordance with one or more aspects of the present invention.

By way of further explanation, FIGS. 3A-3C depict an exemplary implementation of a cooled electronics assembly 300 comprising an electronics card 301 having a circuit board 302 and one or more heat-generating electronic components 303 to be cooled. As illustrated, cooled electronics assembly 300 also includes an electronics cooling assembly 310 coupled to the one or more heat-generating electronic components 303 to be cooled. For instance, a thermal interface material (not shown) may be provided between the electronic component(s) 303 and the cooling assembly 310 to provide good conductive heat transfer from the one or more electronic components 303 to electronics cooling assembly 310.

In the embodiment shown, electronics cooling assembly 310 includes, for instance, an air-cooled heat sink 320, an auxiliary air-moving device 330, and an airflow-blocking mechanism 340. The cooling airflow 307, such as a rack-level, cooling airflow, moves from an air-inlet side 321 to an air-exhaust side 322 of the air-cooled heat sink with the airflow-blocking mechanism 340 in the passive airflow position depicted in FIG. 3B. As noted, airflow-blocking mechanism 340 is in the passive airflow position when auxiliary air-moving device 330 is inactive. In the depicted implementation, airflow 307 passes between a plurality of thermally conductive fins 326 extending from a thermally conductive base 325 of air-cooled heat sink 320. Further, in an implementation where electronics card 301 is a low-profile card (meaning, for instance, that the available height 'h' above the card 301 is limited in the system enclosure within which the electronics card is to be operatively positioned), thermally conductive fins 326 of air-cooled heat sink 320 may be recessed 327 (FIGS. 3B & 3C), in part, to accommodate auxiliary air-moving device 330 within a recessed region 327 of the thermally conductive fins 326.

In one or more implementations, auxiliary air-moving device 330 may be or comprise a centrifugal fan with an air-inlet side 331 and an air-exhaust side 332 orthogonal to each other. By way of example, auxiliary air-moving device 330 could comprise a Sunon Model UB5U3-500 blower offered by Sunonwealth Electric Machine Industry Company, Ltd., of Taiwan, or, for instance, a Murata high-pressure and ultra-thin micro-blower offered by Mouser Electronics Inc., of Mansfield, Tex., USA. These low-profile centrifugal fans may have a height or thickness of only about 3 mm, which works well in a low-profile electronics card implementation where the height 'h' may be limited to 14 or 15 mm in total.

In the depicted example, air-exhaust side 332 of auxiliary air-moving device 330 faces a common direction to air-exhaust side 322 of air-cooled heat sink 320, and in one or more implementations, the air-exhaust sides 322, 332 may substantially align, as illustrated in FIGS. 3B & 3C. As shown, auxiliary air-moving device 330 may include a hub or motor 335 and a rotor 336. In the active mode illustrated in FIG. 3C, an increased flow rate of the cooling airflow 307 is drawn across air-cooled heat sink 320 through air-inlet side 331 of auxiliary air-moving device 330, and exhausted out air-exhaust side 332 of auxiliary air-moving device 330. In a centrifugal fan implementation, the rotor 336 and air-inlet side 331 of auxiliary air-moving device 300 face the air-cooled heat sink, and in particular, the thermally conductive base 325 of the air-cooled heat sink 320, and allows the air-exhaust side 332 of the auxiliary air-moving device 330 to face the same direction as the air-exhaust side 322 of the air-cooled heat sink 320. Note that in the implementation depicted, auxiliary air-moving device 330 is located closer to the air-exhaust side 322 of air-cooled heat sink 320 than the air-inlet side 321. In this position, auxiliary air-moving device 330 functions to draw the increased flow rate of cooling airflow across air-cooled heat sink 320, including over the region of air-cooled heat sink aligned over the one or more electronic components 303 to be cooled. In this regard, auxiliary air-moving device 330 may overlap the one or more electronic components 303 to be cooled, as illustrated in FIGS. 3B & 3C, or could alternatively be disposed, for instance, downstream of the one or more electronic components 303 in a direction of cooling airflow across the air-cooled heat sink 320.

In operation, the airflow-blocking mechanism, in one or more implementations, automatically transitions between the passive airflow position and the active airflow position depending on the state of the auxiliary air-moving device, that is, whether the auxiliary air-moving device is active or inactive. With the auxiliary air-moving device inactive, then as shown in FIG. 3B, the momentum of cooling airflow 307 maintains airflow-blocking mechanism 340, and in particular, the toggle element of the airflow-blocking mechanism in the passive airflow position illustrated. In this position, a first airflow-blocking arm 341 of the toggle element substantially covers air-exhaust side 332 of auxiliary air-moving device 330, and a second airflow-blocking arm 342 of the toggle element, perpendicular to the first airflow-blocking arm 341, is oriented substantially parallel to the direction of cooling airflow 307 across air-cooled heat sink 320.

With activation of auxiliary air-moving device 330, an increased flow rate of cooling airflow 307 is drawn across air-cooled heat sink 320, and through auxiliary air-moving device 330, providing enhanced cooling to the one or more heat-generating electronic components 303 to be cooled. Further, activation of auxiliary air-moving device 330 forces the cooling airflow 307 passing through auxiliary air-moving device 330 out air-exhaust side 332 of auxiliary air-moving device 330, which results in pushing first airflow-blocking arm 341 down to extend in a direction substantially parallel to the cooling airflow 307 exhausting from the air-exhaust side 332 of auxiliary air-moving device 330. This action also results in second airflow-blocking arm 342 pivoting to substantially block air-exhaust side 322 of air-cooled heat sink 320, as shown in FIG. 3C. Advantageously, by blocking the air-exhaust side of air-cooled heat sink 320, airflow-blocking mechanism 340 also prevents air from being drawn in through air-exhaust side 322 of air-cooled heat sink 320 to air-inlet side 331 of auxiliary air-moving device 330.

In one or more implementations, the toggle element of airflow-blocking mechanism 340 may be, for instance, an L-shaped component, with the noted first and second airflow-blocking arms or bars at a fixed angle to each other, such as perpendicular to each other, as illustrated in FIGS. 3B & 3C. The toggle element may be pivotably mounted 343 within electronics cooling assembly 310 at, for instance, a location where air-exhaust side 322 of air-cooled heat sink 320 adjoins air-exhaust side 332 of auxiliary air-moving device 330. Thus, the position of airflow-blocking mechanism 340, whether in the passive airflow position (FIG. 3B) or the active airflow position (FIG. 3C), is passively determined, in one or more implementations, by the state of auxiliary air-moving device 340. If the auxiliary air-moving device is inactive, then the momentum of cooling airflow 307 across air-cooled heat sink 320 ensures that the toggle element of airflow-blocking mechanism 340 remains in the illustrated passive airflow position of FIG. 3B, and if auxiliary air-moving device 330 is active, then the momentum of the increased flow rate of cooling airflow 307 through air-moving device 330 forces the toggle element into the active airflow position, or forced airflow position, illustrated in FIG. 3C.

Figure 6:
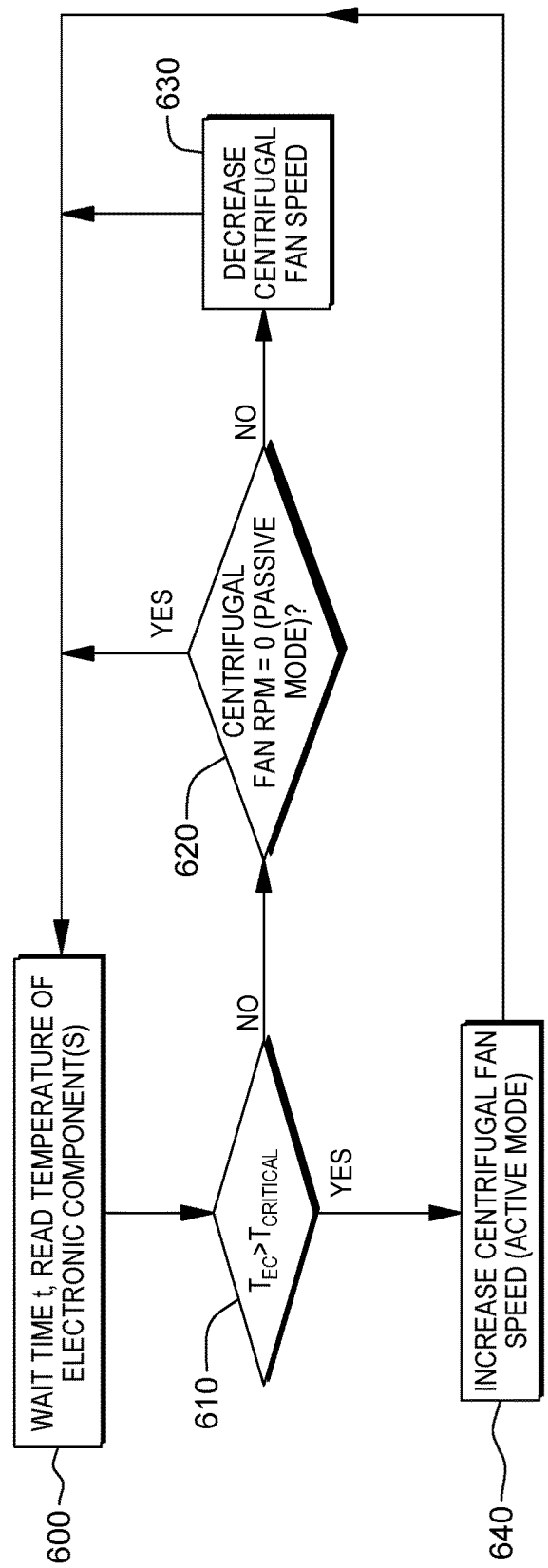
FIG. 6 depicts one embodiment of a control process for controlling operation of the auxiliary air-moving device of an electronics cooling assembly, in accordance with one or more aspects of the present invention.

Electronics cooling assembly 310 may further include a controller 350 which may implement a process for controlling operation of auxiliary air-moving device 330. In one or more implementations, controller 350 may comprise, for instance, a processor and associated memory, along with computer program product code to implement a process, such as depicted in FIG. 6. The controller may receive readings from one or more temperature sensors, such as a temperature sensor $T_{EC}$, and/or temperature sensor $T_A$. In the example of FIGS. 3B & 3C, temperature sensor $T_{EC}$ monitors temperature of the one or more heat-generating electronic components 303 to be cooled, and temperature sensor $T_A$ may monitor temperature of the ingressing cooling airflow 307 passing across the air-cooled heat sink 320. Either temperature sensed, or a combination of multiple sensed temperatures may be employed in a control process such as depicted in FIG. 6, which is described herein below. Note that temperature sensors $T_{EC}$ and $T_A$ are provided by way of example only. Other temperature sensors, such as a temperature sensor to sense temperature of the heat sink directly over the one or more electronic components, could be employed in a control process for determining whether to initiate or increase active airflow cooling by control of the auxiliary air-moving device. Also, although described herein as passively translating between the passive airflow position and the active airflow position, active control of the airflow-blocking mechanism could be provided by controller 350 and an appropriate control mechanism to control orientation of, for instance, the toggle element.

Figure 4:
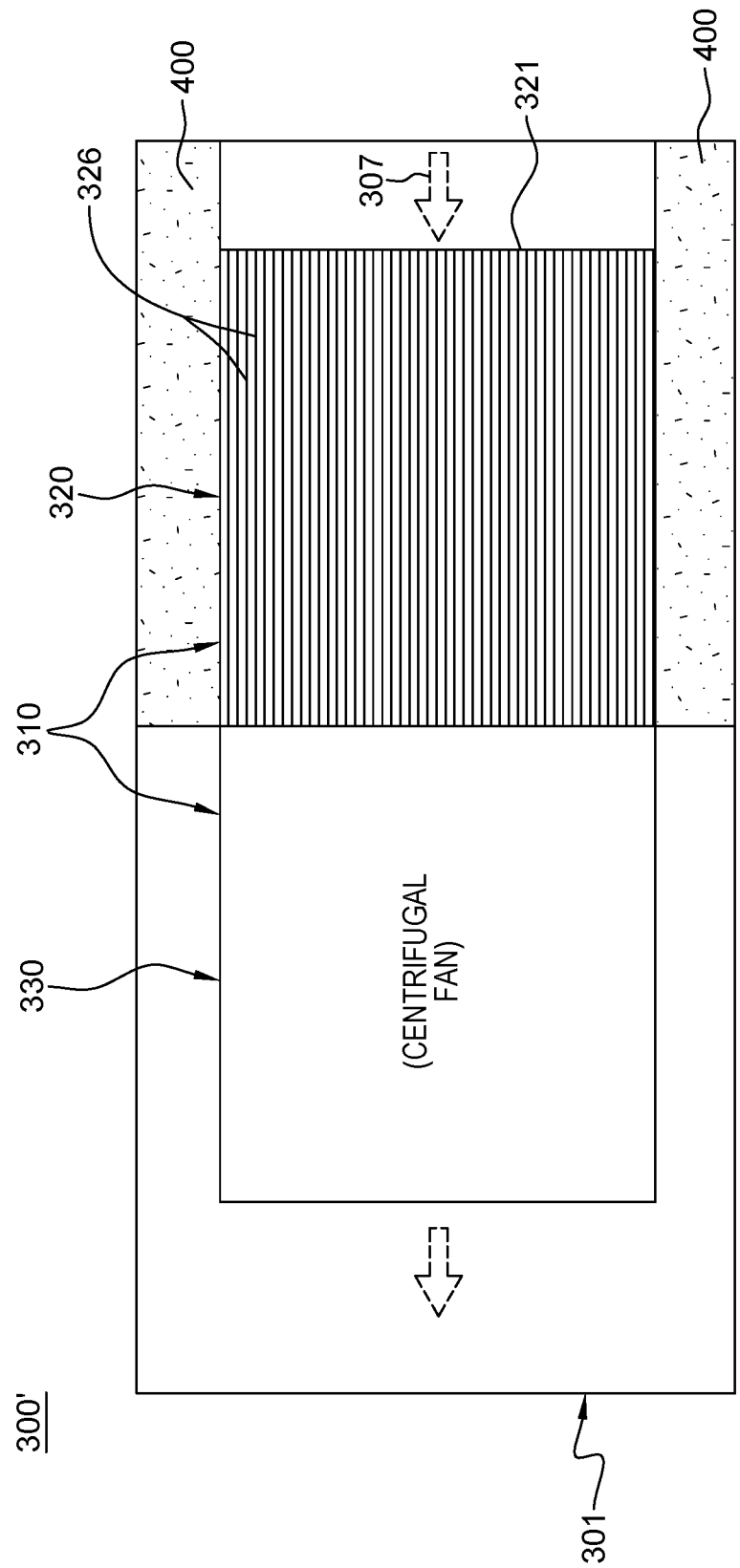
FIG. 4 is a plan view of an alternate embodiment of the cooled electronics assembly of FIGS. 3A-3C, in accordance with one or more aspects of the present invention.

By way of further example, FIG. 4 depicts an alternate embodiment of an electronics cooling assembly 300' substantially identical to electronics cooling assembly 300 of FIGS. 3A-3C, but with the addition of baffles 400 at either side of the plurality of thermally conductive fins 326 of air-cooled heat sink 320. Baffles 400 may be provided to facilitate directing cooling airflow 307 into the air-cooled heat sink 320 at the air-inlet side 321 to pass between the plurality of thermally conductive fins 326 of the heat sink.

Figure 5A:
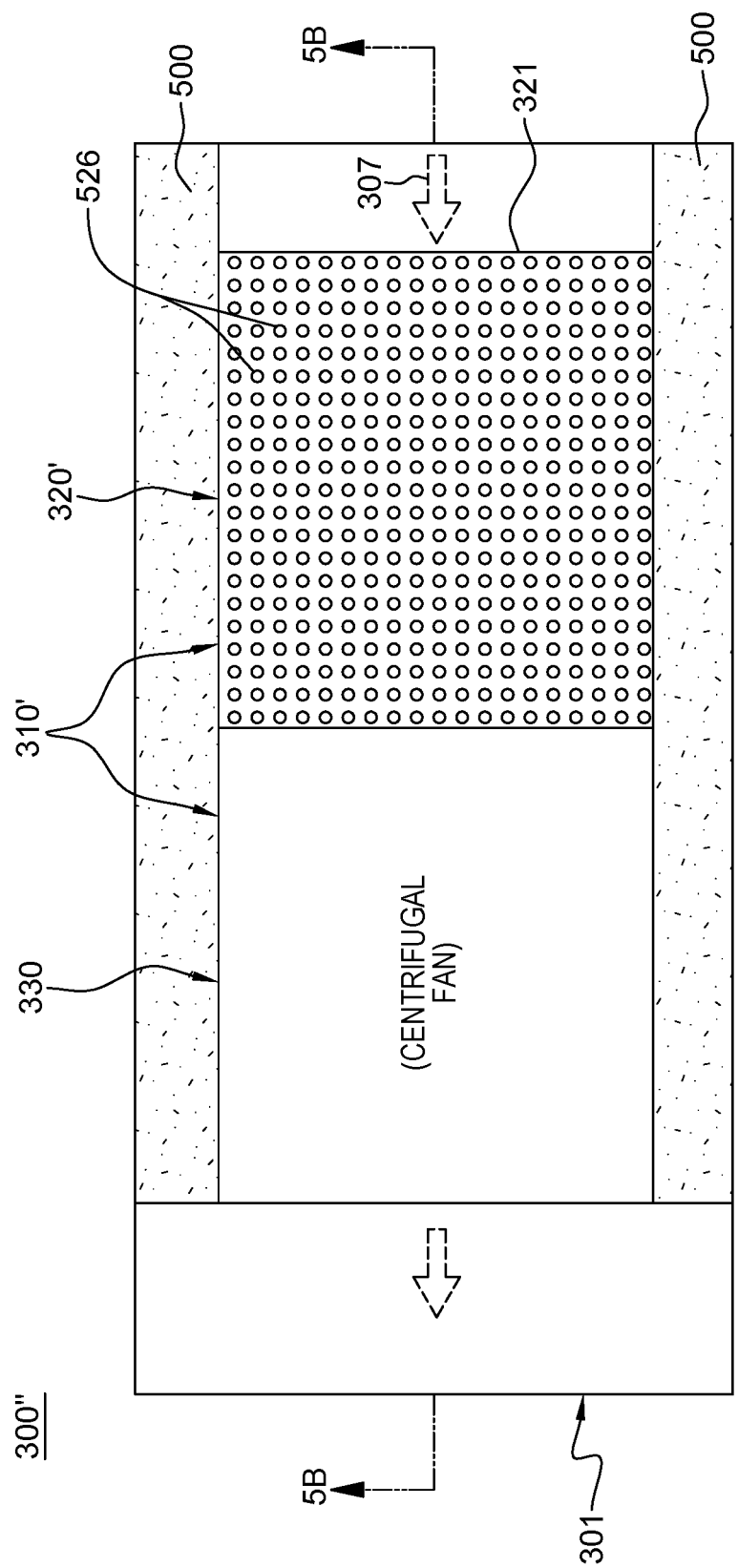
FIG. 5A is a plan view of a further embodiment of a cooled electronics assembly comprising an electronic cooling assembly cooling one or more heat-generating electronic components, in accordance with one or more aspects of the present invention.
Figure 5B:
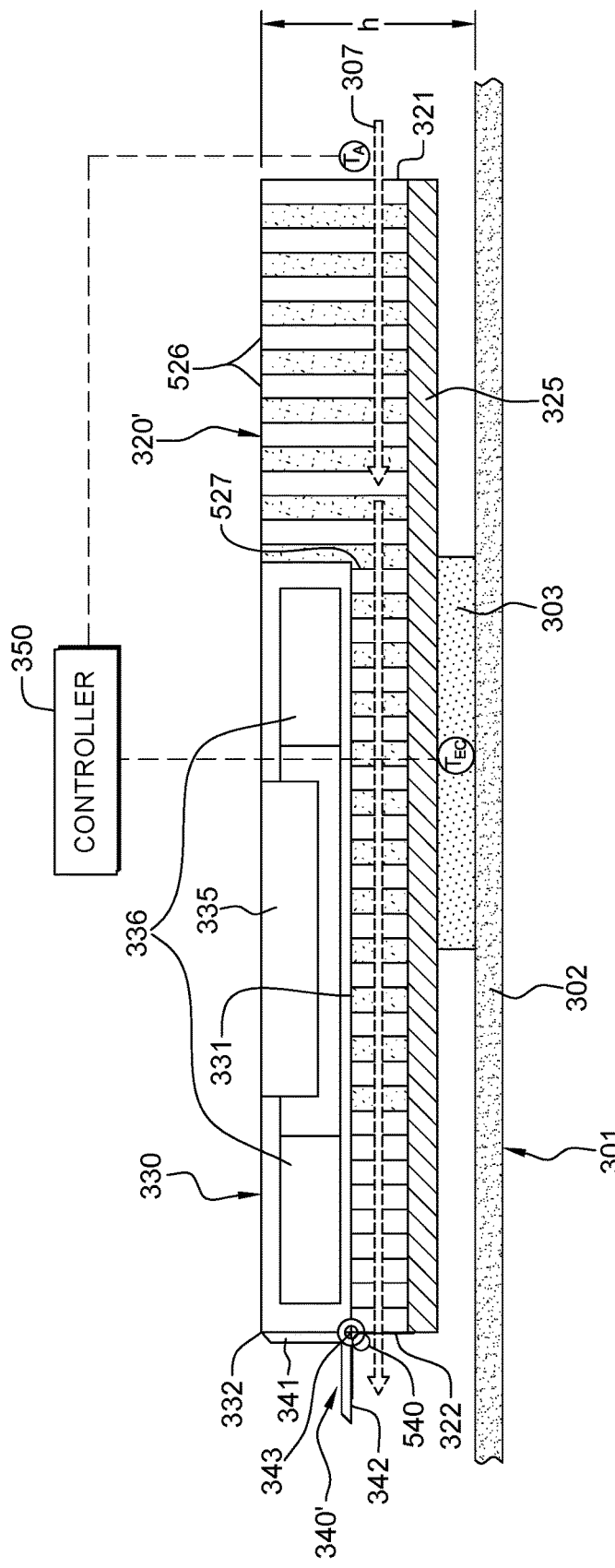
FIG. 5B is a cross-sectional elevational view of the cooled electronics assembly of FIG. 5A, taken along line 5B-5B thereof, and showing an alternate embodiment of the airflow-blocking mechanism in a passive airflow position, in accordance with one or more aspects of the present invention.

FIGS. 5A & 5B depict a further implementation of a cooled electronic assembly 300" comprising an electronics card 301 having a circuit board 302 and one or more heat-generating electronic components 303 to be cooled. As illustrated, cooled electronic assembly 300" includes an electronics cooling assembly 310' coupled to the one or more heat-generating electronic components 303 to be cooled. For instance, a thermal interface material (not shown) may be provided between the electronic component(s) 303 and the cooling assembly 310' to provide good conductive heat transfer from the one or more electronic components 303 to electronics cooling assembly 310'.

In the embodiment shown, electronics cooling assembly 310' includes, for instance, an air-cooled heat sink 320', an auxiliary air-moving device 330, and an airflow-blocking mechanism 340'. The cooling airflow 307, such as a server-level or rack-level, cooling airflow, moves from air-inlet side 321 to air-outlet side 322 of air-cooled heat sink 320', with the airflow-blocking mechanism 340' in the passive airflow position depicted in FIG. 5B. As explained herein, airflow-blocking mechanism 340' is in the passive airflow position when auxiliary air-moving device 330 is inactive. In the depicted implementation, cooling airflow 307 passes between a plurality of thermally conductive pin fins 526 extending from thermally conductive base 325 of air-cooled heat sink 320'. Further, in an implementation where electronics card 301 is a low-profile card, meaning, for example, that the height 'h' above the card is limited, such as, to 15 mm or less, then thermally conductive fins 526 of air-cooled heat sink 320' may be recessed 527 (FIG. 5B), in part, to accommodate auxiliary air-moving device 330 within a recessed portion of thermally conductive fins 526. Baffles 500 (FIG. 5A) may be provided in this implementation on either side of air-cooled heat sink 320' to ensure that cooling airflow 307 is drawn from air-inlet side 321 of air-cooled heat sink 320', rather than from the sides of the heat sink. Note in this regard that, if desired, one or more baffles could also be employed in combination with the electronic cooling assembly 300 of FIGS. 3A-3C. However, in that implementation, thermally conductive plate fins 320 are illustrated, which inherently function (in part) to direct cooling airflow 307 from the air-inlet side towards the air-outlet side of the air-cooled heat sink 320.

In the exemplary embodiment of FIGS. 5A & 5B, auxiliary air-moving device 330 is substantially identical in position and function to that described above in connection with FIGS. 3A-3C. Further, airflow-blocking mechanism 340' is similar to that described above in connection with FIGS. 3A-3C, but with the addition of a spring 540 which functions to bias the airflow-blocking mechanism in the passive airflow position depicted in FIG. 5B. The biasing spring 540 advantageously facilitates maintaining airflow-blocking mechanism 340' in the passive airflow position when auxiliary air-moving device 330 is inactive. Further, the biasing spring 540 is chosen so that, upon activation of the auxiliary device, the increased flow rate of cooling airflow across the air-cooled heat sink 320' and through the auxiliary air-moving device 330 is sufficient to force the airflow-blocking mechanism 340' into an active airflow position, similar to that shown in FIG. 3C.

Referring to FIG. 6, controller 350 (FIGS. 3B, 3C & 5B) of the cooled electronics assembly may implement a process which includes, for instance, waiting a time interval t before reading temperature of one or more monitored sensors, such as the temperature $T_{EC}$ of the electronic component(s) 600. The controller determines whether the read temperature is above a critical temperature threshold 610, and if "no", determines whether the rotor of the auxiliary air-moving device is moving, that is, whether the auxiliary air-moving device is in passive mode 620. If "yes", then the controller returns to await interval time t before again reading the temperature of, for instance, the electronic component(s). Assuming that the auxiliary air-moving device is active, then from inquiry 620 processing may decrease the speed of the air-moving device 630, for instance, by an incremental amount, before waiting time interval t and then reading the sensed temperature(s). By stepwise decreasing the speed of the auxiliary air-moving device, for example, the centrifugal fan, energy efficiency is gained, and acoustic noise is reduced, provided the monitored temperature of the electronic component(s) remains below the critical threshold. Assuming that the temperature read is at or above the critical threshold for active cooling, then the air-moving device speed is increased, for instance, either from zero, placing the auxiliary air-moving device in active mode, or if already active, the RPMs of the centrifugal fan may be stepwise increased 640, after which the controller returns to await time interval "t" 600.

Figure 7:
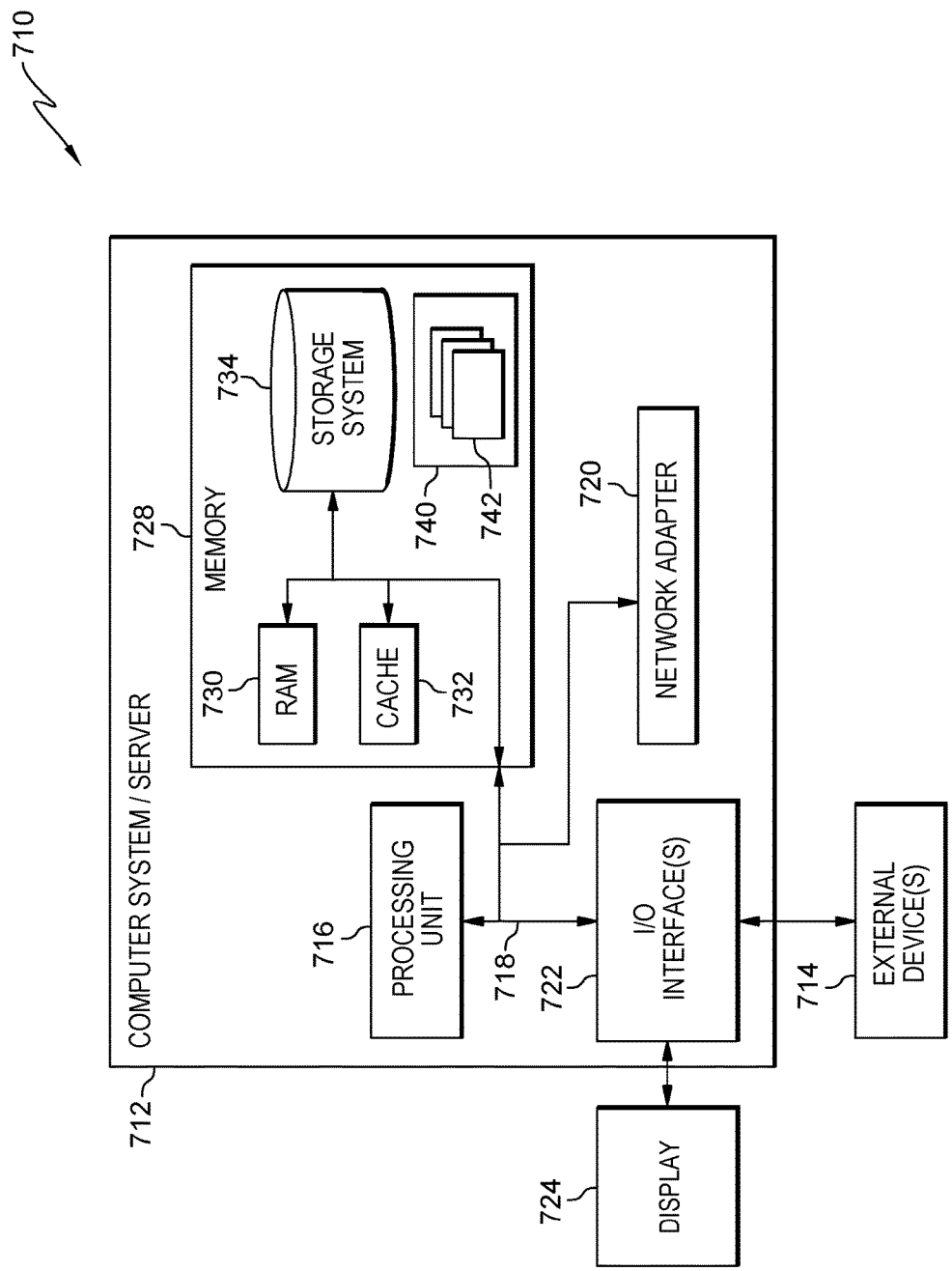
FIG. 7 depicts one embodiment of a data processing system which may implement one or more control aspects of the present invention.

Referring now to FIG. 7, a schematic of an example of a data processing system 710 is shown, which may be used to implement the controller. Data processing system 710 is only one example of a suitable data processing system and is not intended to suggest any limitation as to the scope of use or functionality of embodiments of the invention described herein. Regardless, data processing system 710 is capable of being implemented and/or performing any of the functionality set forth herein above, such as the cooling apparatus controller functionality discussed.

In data processing system 710 there is a computer system/server 712, which is operational with numerous other general purpose or special purpose computing system environments or configurations. Examples of well-known computing systems, environments, and/or configurations that may be suitable for use with computer system/server 712 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 712 may be described in the general context of computer system executable instructions, such as program modules, being executed by a computer system. Generally, program modules may include routines, programs, objects, components, logic, data structures, and so on that perform particular tasks or implement particular abstract data types. Computer system/server 712 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, computer system/server 712 in data processing system 710 is shown in the form of a general-purpose computing device. The components of computer system/server 712 may include, but are not limited to, one or more processors or processing units 716, a system memory 728, and a bus 718 that couples various system components including system memory 728 to processor 716.

Bus 718 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), Micro Channel Architecture (MCA), Enhanced ISA (EISA), Video Electronics Standards Association (VESA), and Peripheral Component Interconnect (PCI).

Computer system/server 712 typically includes a variety of computer system readable media. Such media may be any available media that is accessible by computer system/server 712, and it includes both volatile and non-volatile media, removable and non-removable media.

System memory 728 can include computer system readable media in the form of volatile memory, such as random access memory (RAM) 730 and/or cache memory 732. Computer system/server 712 may further include other removable/non-removable, volatile/non-volatile computer system storage media. By way of example only, storage system 734 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 718 by one or more data media interfaces. As will be further depicted and described below, memory 728 may include at least one program product having a set (e.g., at least one) of program modules that are configured to carry out the functions of embodiments of the invention.

Program/utility 740, having a set (at least one) of program modules 742, may be stored in memory 728 by way of example, and not limitation, as well as an operating system, one or more application programs, other program modules, and program data. Each of the operating system, one or more application programs, other program modules, and program data or some combination thereof, may include an implementation of a networking environment. Program modules 742 generally carry out the functions and/or methodologies of embodiments of the invention as described herein.

Computer system/server 712 may also communicate with one or more external devices 714 such as a keyboard, a pointing device, a display 724, etc.; one or more devices that enable a user to interact with computer system/server 712; and/or any devices (e.g., network card, modem, etc.) that enable computer system/server 712 to communicate with one or more other computing devices. Such communication can occur via Input/Output (I/O) interfaces 722. Still yet, computer system/server 712 can communicate with one or more networks such as a local area network (LAN), a general wide area network (WAN), and/or a public network (e.g., the Internet) via network adapter 720. As depicted, network adapter 720 communicates with the other components of computer system/server 712 via bus 718. It should be understood that although not shown, other hardware and/or software components could be used in conjunction with computer system/server 712. Examples, include, but are not limited to: microcode, device drivers, redundant processing units, external disk drive arrays, RAID systems, tape drives, and data archival storage systems, etc.

The control aspects of the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of aspects of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Certain aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An electronics cooling assembly comprising:
   an air-cooled heat sink to couple to one or more heat-generating electronic components to be cooled, the air-cooled heat sink to dissipate heat from the one or more heat-generating electronic components to a cooling airflow passing across the air-cooled heat sink;
   an auxiliary air-moving device associated with the air-cooled heat sink and providing, when active, an increased flow rate of the cooling airflow across the air-cooled heat sink; and
   an airflow-blocking mechanism, the airflow-blocking mechanism toggling between a passive airflow position and an active airflow position, wherein in the passive airflow position, the airflow-blocking mechanism allows the cooling airflow to exhaust from the air-cooled heat sink without passing through the auxiliary air-moving device, and in the active airflow position, the airflow-blocking mechanism allows the cooling airflow to exhaust from the auxiliary air-moving device.

2. The electronics cooling assembly of claim 1, wherein the auxiliary air-moving device overlies, at least in part, the air-cooled heat sink, the air-cooled heat sink comprises an air-exhaust side, and the auxiliary air-moving device comprises an air-exhaust side, and wherein the cooling airflow exhausts from the air-exhaust side of the air-cooled heat sink with the airflow-blocking mechanism in the passive airflow position, and exhausts from the air-exhaust side of the auxiliary air-moving device with the airflow-blocking mechanism in the active airflow position.

3. The electronics cooling assembly of claim 2, wherein the airflow-blocking mechanism comprises a toggle element with a first airflow-blocking arm and a second airflow-blocking arm disposed at a fixed angle, and wherein in the passive airflow position, the first airflow-blocking arm of the toggle element inhibits airflow from exhausting from the air-exhaust side of the auxiliary air-moving device, and in the active airflow position, the second airflow-blocking arm of the toggle element inhibits airflow from exhausting from the air-exhaust side of the air-cooled heat sink.

4. The electronics cooling assembly of claim 3, wherein the air-exhaust side of the air-cooled heat sink and the air-exhaust side of the auxiliary air-moving device face a common direction.

5. The electronics cooling assembly of claim 3, wherein the first airflow-blocking arm of the toggle element is orthogonal to the second airflow-blocking arm of the toggle element, and the toggle element pivots to transition the airflow-blocking mechanism from the passive airflow position to the active airflow position with activating of the auxiliary air-moving device.

6. The electronics cooling assembly of claim 1, wherein the auxiliary air-moving device is a centrifugal fan, the centrifugal fan overlying, at least in part, the air-cooled heat sink, and having an air-inlet side facing the air-cooled heat sink.

7. The electronics cooling assembly of claim 6, wherein the air-cooled heat sink comprises a thermally conductive base with a plurality of thermally conductive fins extending from the thermally conductive base, and with the airflow-blocking mechanism in the passive airflow position, the cooling airflow moves across the plurality of thermally conductive fins in a direction substantially parallel to the thermally conductive base of the air-cooled heat sink, between the thermally conductive base of the air-cooled heat sink and the centrifugal fan.

8. The electronics cooling assembly of claim 7, wherein the thermally conductive fins of the plurality of thermally conductive fins are recessed, at least in part, to accommodate the centrifugal fan within a recessed region of the plurality of thermally conductive fins.

9. The electronics cooling assembly of claim 1, wherein with the auxiliary air-moving device inactive, the cooling airflow passing across the air-cooled heat sink maintains the airflow-blocking mechanism in the passive airflow position, and with activation of the auxiliary air-moving device, the increased flow rate of the cooling airflow passing through the auxiliary air-moving device transitions the airflow-blocking mechanism from the passive airflow position to the active airflow position.

10. The electronics cooling assembly of claim 1, further comprising one or more baffles associated with the air-cooled heat sink to facilitate directing the cooling airflow from an air-inlet side of the air-cooled heat sink, across the air-cooled heat sink, towards an air-exhaust side of the air-cooled heat sink, the auxiliary air-moving device overlying the air-cooled heat sink closer to the air-exhaust side of the air-cooled heat sink than the air-inlet side of the air-cooled heat sink.

11. A cooled electronics assembly comprising:
at least one heat-generating electronic component;
an electronics cooling assembly, the electronics cooling assembly comprising:
  an air-cooled heat sink coupled to the at least one heat-generating electronic component, the air-cooled heat sink dissipating heat from the at least one heat-generating electronic component to a cooling airflow passing across the air-cooled heat sink;
  an auxiliary air-moving device associated with the air-cooled heat sink and providing, when active, an increased flow rate of the cooling airflow across the air-cooled heat sink; and
  an airflow-blocking mechanism, the airflow-blocking mechanism toggling between a passive airflow position and an active airflow position, wherein in the passive airflow position, the airflow-blocking mechanism allows the cooling airflow to exhaust from the air-cooled heat sink without passing through the auxiliary air-moving device, and in the active airflow position, the airflow-blocking mechanism allows the cooling airflow to exhaust from the auxiliary air-moving device.

12. The cooled electronics assembly of claim 11, wherein the at least one heat-generating electronic component is at least one heat-generating electronic component of an input/output adapter card or a GPU card.

13. The cooled electronics assembly of claim 11, wherein the auxiliary air-moving device overlies, at least in part, the air-cooled heat sink, the air-cooled heat sink comprises an air-exhaust side, and the auxiliary air-moving device comprises an air-exhaust side, and wherein the cooling airflow exhausts from the air-exhaust side of the air-cooled heat sink with the airflow-blocking mechanism in the passive airflow position, and exhausts from the air-exhaust side of the auxiliary air-moving device with the airflow-blocking mechanism in the active airflow position.

14. The cooled electronics assembly of claim 13, wherein the airflow-blocking mechanism comprises a toggle element with a first airflow-blocking arm and a second airflow-blocking arm disposed at a fixed angle, and wherein in the passive airflow position, the first airflow-blocking arm of the toggle element inhibits airflow from exhausting from the air-exhaust side of the auxiliary air-moving device, and in the active airflow position, the second airflow-blocking arm of the toggle element inhibits airflow from exhausting from the air-exhaust side of the air-cooled heat sink.

15. The cooled electronics assembly of claim 14, wherein the first airflow-blocking arm of the toggle element is orthogonal to the second airflow-blocking arm of the toggle element, and the toggle element pivots to transition the airflow-blocking mechanism from the passive airflow position to the active airflow position with activating of the auxiliary air-moving device.

16. The cooled electronics assembly of claim 11, wherein the auxiliary air-moving device is a centrifugal fan, the centrifugal fan overlying, at least in part, the air-cooled heat sink, and having an air-inlet side facing the air-cooled heat sink.

17. The cooled electronics assembly of claim 16, wherein the air-cooled heat sink comprises a thermally conductive base with a plurality of thermally conductive fins extending from the thermally conductive base, and with the airflow-blocking mechanism in the passive airflow position, the cooling airflow moves across the plurality of thermally conductive fins in a direction substantially parallel to the thermally conductive base of the air-cooled heat sink, between the thermally conductive base of the air-cooled heat sink and the centrifugal fan.

18. The cooled electronics assembly of claim 17, wherein the thermally conductive fins of the plurality of thermally conductive fins are recessed, at least in part, to accommodate the centrifugal fan within a recessed region of the plurality of thermally conductive fins.

19. The cooled electronics assembly of claim 11, wherein with the auxiliary air-moving device inactive, the cooling airflow passing across the air-cooled heat sink maintains the airflow-blocking mechanism in the passive airflow position, and with activation of the auxiliary air-moving device, the increased flow rate of the cooling airflow passing through the auxiliary air-moving device transitions the airflow-blocking mechanism from the passive airflow position to the active airflow position.

* * * * *